(12) United States Patent
Johnson

(10) Patent No.: US 11,561,476 B1
(45) Date of Patent: Jan. 24, 2023

(54) UV LITHOGRAPHY SYSTEM

(71) Applicant: Kenneth Carlisle Johnson, Santa Clara, CA (US)

(72) Inventor: Kenneth Carlisle Johnson, Santa Clara, CA (US)

( * ) Notice: Subject to any disclaimer, the term of this patent is extended or adjusted under 35 U.S.C. 154(b) by 18 days.

(21) Appl. No.: 17/372,446

(22) Filed: Jul. 10, 2021

(51) Int. Cl.
*G03F 7/20* (2006.01)

(52) U.S. Cl.
CPC ...... *G03F 7/70233* (2013.01); *G03F 7/70275* (2013.01); *G03F 7/70283* (2013.01); *G03F 7/70641* (2013.01)

(58) Field of Classification Search
CPC .......................... G03F 7/70216; G03F 7/70233
See application file for complete search history.

(56) References Cited

U.S. PATENT DOCUMENTS

| | | | | |
|---|---|---|---|---|
| 4,861,148 A * | 8/1989 | Sato | ............. | G03F 7/70225 359/728 |
| 5,212,588 A * | 5/1993 | Viswanathan | ...... | G03F 7/70233 359/859 |
| 5,488,229 A * | 1/1996 | Elliott | ............. | G03F 7/70225 250/492.2 |
| 5,650,877 A * | 7/1997 | Phillips, Jr. | ......... | G03F 7/70225 359/621 |
| 5,717,518 A | 2/1998 | Shafer et al. | | |
| 6,970,228 B1 * | 11/2005 | Aoki | ............. | G03F 7/70883 355/53 |
| 9,097,983 B2 | 8/2015 | Johnson | | |

| | | | | |
|---|---|---|---|---|
| 2001/0038446 A1 * | 11/2001 | Takahashi | ........... | G03F 7/70891 359/357 |
| 2002/0044260 A1 * | 4/2002 | Takahashi | ............. | G02B 27/18 353/31 |
| 2002/0085271 A1 * | 7/2002 | Shafer | .............. | G03F 1/84 359/359 |
| 2003/0002147 A1 * | 1/2003 | Chuang | ............. | G02B 17/08 359/364 |
| 2003/0030917 A1 * | 2/2003 | Omura | ............. | G02B 17/0892 359/651 |
| 2003/0076583 A1 * | 4/2003 | Shafer | .............. | G03F 7/70275 359/357 |

(Continued)

OTHER PUBLICATIONS

Johnson, Kenneth C. "EUV Lithography System with Diffraction Optics", 2019. https://vixra.org/pdf/1911.0361v1.pdf.

(Continued)

*Primary Examiner* — Steven Whitesell Gordon

(57) ABSTRACT

A multifunction UV or DUV (ultraviolet/deep-ultraviolet) lithography system uses a modified Schwarzschild flat-image projection system to achieve diffraction-limited, distortion-free and double-telecentric imaging over a large image field at high numerical aperture. A back-surface primary mirror enables wide-field imaging without large obscuration loss, and additional lens elements enable diffraction-limited and substantially distortion-free, double-telecentric imaging. The system can perform maskless lithography (either source-modulated or spatially-modulated), mask-projection lithography (either conventional imaging or holographic), mask writing, wafer writing, and patterning of large periodic or aperiodic structures such as microlens arrays and spatial light modulators, with accurate field stitching to cover large areas exceeding the image field size.

10 Claims, 13 Drawing Sheets

(56) References Cited

U.S. PATENT DOCUMENTS

| | | | | |
|---|---|---|---|---|
| 2004/0114217 A1* | 6/2004 | Mann | ............... | G03F 7/70233 |
| | | | | 359/729 |
| 2004/0165257 A1* | 8/2004 | Shafer | ............ | G02B 17/0892 |
| | | | | 359/366 |
| 2005/0152027 A1* | 7/2005 | Armstrong | ....... | G03F 7/70341 |
| | | | | 359/366 |
| 2020/0073251 A1* | 3/2020 | Smith | ................. | G03F 7/702 |

OTHER PUBLICATIONS

K. Johnson. "EUV Lithography Design Concepts using Diffraction Optics", in 2020 EUVL Workshop, P22, EUV Litho, Inc. https://vixra.org/pdf/2007.0167v2.pdf.

M. Bass, ed., Handbook of Optics, 2nd ed. (Optical Society of America, Washington, DC, 1995), vol. 2. (p. 18.15).

* cited by examiner

Predetermined design specifications for FIG. 3:
  wavelength: 266 nm
  image-side NA: 0.65
  demagnification: 4X
  image field diameter: 10 mm
  M2 diameter: 440 mm
  M1B working distance ($\omega$): 5 mm
  L2B edge to M2 $x_1$ offset: 0
  object-L1F axial spacing: 1 mm
  L1F-L1B axial spacing: 10 mm
  L2F-L2B axial spacing: 15 mm
  M1F-M1B axial spacing: 75 mm
  refractive index: 1.4997 for lenses, 1 for ambient

FIG. 10A

Calculated design specifications for FIG. 3
  L1B-L2F axial spacing: 154.0072234871880 mm
  L2B-M2 axial spacing: -1.634860907667581 mm
  M2-M1F axial spacing: 282.0331968453904 mm
  M1B-Image axial spacing: 11.554433034645530 mm
  object field diameter: 40 mm
  L1F diameter: 40.613 mm
  L1B diameter: 42.087 mm
  L2F diameter: 80.452 mm
  L2B diameter: 83.265 mm
  M2 inner diameter: 83.265 mm
  M1F diameter: 222.555 mm
  M1B outer diameter: 171.337 mm
  M1B inner diameter (window): 29.463 mm

FIG. 10B

Calculated design specifications for FIG. 3 (cont'd.)
 superconic shape function:
 $$x_1 = x_x^{[ctr]} + \tfrac{1}{2}(c_1 \, ss + c_2 \, ss^2 + ...) \quad \text{with } ss = (x_1 - x_x^{[ctr]})^2 + x_2^2 + x_3^2$$
 L1F shape coefficients
  c1 = 0.004172361276933890 mm$^{-1}$
 L1B shape coefficients
  c1 = 4.432729411000084*10^-4 mm$^{-1}$
 L2F shape coefficients
  c1 = -4.608926605071417*10^-4 mm$^{-1}$
 L2B shape coefficients
  c1 = 3.914656583210775*10^-4 mm$^{-1}$
  c2 = 3.309051823504009*10^-8 mm$^{-3}$
  c3 = 5.407298489199852*10^-13 mm$^{-5}$
 M1F shape coefficients
  c1 = 0.002078571209718 mm$^{-1}$
  c2 = 1.320908800476624*10^-8 mm$^{-3}$
  c3 = 2.970870943881886*10^-13 mm$^{-5}$
  c4 = -1.083763564160659*10^-18 mm$^{-7}$
  c5 = 1.016785350810261*10^-22 mm$^{-9}$
  c6 = -1.888267448361106*10^-27 mm$^{-11}$
 M1B shape coefficients
  c1 = 0.001625974296355 mm$^{-1}$
  c2 = 1.747806165826325*10^-8 mm$^{-3}$
  c3 = 3.459141578376934*10^-13 mm$^{-5}$
  c4 = 3.136927235510388*10^-18 mm$^{-7}$
  c5 = 2.264489295923250*10^-22 mm$^{-9}$
 M2 shape coefficients
  c1 = 0.002330876267704 mm$^{-1}$
  c2 = 3.139194434473052*10^-10 mm$^{-3}$
  c3 = 1.621439457619735*10^-16 mm$^{-5}$
  c4 = -2.650070367158696*10^-22 mm$^{-7}$
  c5 = -6.292510128788431*10^-27 mm$^{-9}$

FIG. 10C

Design performance characteristics for FIG. 3
 wavefront phase error: 0.0013-wave RMS, 0.0056-wave P-V
 distortion: 0.002 nm at image
 telecentricity error: 0.004 mrad at image
 image-side obscuration NA: 0.141 (4.7% aerial obscuration)
 radial clearance for zero-order stop ($\delta$): 3.0 mm

FIG. 10D

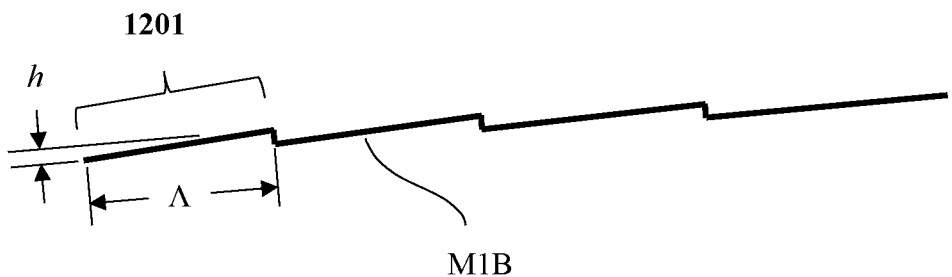

FIG. 12

Predetermined design specifications for FIG. 11:
    wavelength: 266 nm
    image-side NA: 0.65
    image-side obscuration NA: 0.13 (4% areal obscuration)
    demagnification: 4X
    image field diameter: 10 mm
    M2 diameter: 440 mm
    M1B working distance ($\omega$): 8 mm
    L2B edge to M2 $x_1$ offset: 0
    radial clearance for zero-order stop ($\delta$): 3.0 mm
    object-L1F axial spacing: 1 mm
    L1F-L1B axial spacing: 10 mm
    L2F-L2B axial spacing: 15 mm
    M1F-M1B axial spacing: 75 mm
    refractive index: 1.4997 for lenses, 1 for ambient

FIG. 13A

Calculated design specifications for FIG. 11
    L1B-L2F axial spacing: 150.3921558432182 mm
    L2B-M2 axial spacing: 2.869457745502288 mm
    M2-M1F axial spacing: 296.6770446101293 mm
    M1B-Image axial spacing: 11.833995749332553 mm
    object field diameter: 40 mm
    L1F diameter: 40.745 mm
    L1B diameter: 41.917 mm
    L2F diameter: 78.086 mm
    L2B diameter: 79.761 mm
    M2 inner diameter: 79.761 mm
    M1F diameter: 241.887 mm
    M1B outer diameter: 201.738 mm
    M1B inner diameter (window): 30.120 mm

FIG. 13B

Calculated design specifications for FIG. 11, cont'd.
    grating phase function:
$$GP = c_1\, rr + c_2\, rr^2 + \ldots \quad \text{with } rr = x_2^2 + x_3^2$$
    M1B grating phase coefficients:
        $c1 = 5.548407782567191$ mm$^{-2}$
        $c2 = -1.497736277210898 \ast 10\wedge\text{-}05$ mm$^{-4}$
        $c3 = 3.918826961541135 \ast 10\wedge\text{-}09$ mm$^{-6}$
        $c4 = -7.115439617011685 \ast 10\wedge\text{-}13$ mm$^{-8}$
        $c5 = 1.772113117414635 \ast 10\wedge\text{-}17$ mm$^{-10}$
        $c6 = -1.636394900019028 \ast 10\wedge\text{-}22$ mm$^{-12}$
        $c7 = 2.608729264673140 \ast 10\wedge\text{-}27$ mm$^{-14}$

FIG. 13C

Calculated design specifications for FIG. 11 (cont'd.)
  superconic shape function:
  $$x_1 = x_x^{[ctr]} + \tfrac{1}{2}(c_1\, ss + c_2\, ss^2 + \ldots) \quad \text{with } ss = (x_1 - x_x^{[ctr]})^2 + x_2^2 + x_3^2$$
  L1F shape coefficients
    c1 = 0.005797105624642 $mm^{-1}$
    c2 = 6.133047526417921*10^-7 $mm^{-3}$
    c3 = 4.522264734835411*10^-11 $mm^{-5}$
  L1B shape coefficients
    c1 = 0.001456302617499 $mm^{-1}$
    c2 = 6.070344738417288*10^-7 $mm^{-3}$
    c3 = 1.783261022008494*10^-10 $mm^{-5}$
  L2F shape coefficients
    c1 = 0.002398009783234 $mm^{-1}$
  L2B shape coefficients
    c1 = 0.005666053200830 $mm^{-1}$
    c2 = -3.141767308471432*10^-9 $mm^{-3}$
  M1F shape coefficients
    c1 = 0.003236736744213 $mm^{-1}$
    c2 = 4.296723467234719*10^-9 $mm^{-3}$
    c3 = -1.701583700717525*10^-13 $mm^{-5}$
    c4 = -5.593318450100760*10^-18 $mm^{-7}$
    c5 = -1.783768245017495*10^-22 $mm^{-9}$
    c6 = -1.325771818693417*10^-26 $mm^{-11}$
  M1B shape coefficients
    c1 = 6.382350677007274*10^-4 $mm^{-1}$
    c2 = 1.030893117486819*10^-8 $mm^{-3}$
    c3 = -8.000925518691561*10^-13 $mm^{-5}$
    c4 = 1.194972439659404*10^-16 $mm^{-7}$
    c5 = -3.159683182835623*10^-21 $mm^{-9}$
  M2 shape coefficients
    c1 = 0.002122646632560 $mm^{-1}$
    c2 = 1.542418337806363*10^-10 $mm^{-3}$
    c3 = 2.091072916356447*10^-16 $mm^{-5}$
    c4 = 7.485203608327427*10^-22 $mm^{-7}$
    c5 = 1.541284611960221*10^-27 $mm^{-9}$

FIG. 13D

Design performance characteristics for FIG. 11
  wavefront phase error: 0.0011-wave RMS, 0.0052-wave P-V
  distortion: 0.09 nm at image
  telecentricity error: 0.16 mrad at image

FIG. 13E

UV LITHOGRAPHY SYSTEM

CROSS-REFERENCE TO RELATED APPLICATION(S)

This application claims the benefit under 35 U.S.C. § 119(e) of the following two applications, both of which name Kenneth C. Johnson as the inventor, and both of which are incorporated by reference in their entirety for all purposes:

U.S. Patent Application No. 63/050,850, filed Jul. 12, 2020 for "UV Lithography System" (hereafter "the '850 application"); and U.S. Patent Application No. 63/087,302, filed Oct. 5, 2020 for "UV Lithography System" (hereafter "the '302 application").

BACKGROUND OF THE INVENTION

This application pertains to ultraviolet (UV) and deep-ultraviolet (DUV) lithography, including mask-projection and maskless lithography, in the context of semiconductor and microsystems manufacture. For the purpose of this disclosure, the acronym "UV" will be used generically to include DUV. Although the focus of the disclosure is on UV lithography, the devices and methods disclosed herein are equally applicable to lithography at visible-light wavelengths, or at any wavelength that can be focused with optical glass lenses such as fused silica ($SiO_2$), calcium fluoride ($CaF_2$), etc.

Background patents and non-patent literature references relevant to this application are listed at the end of the disclosure in the References section.

UV lithography systems operate at wavelengths down to 193 nm and provide wide-field, diffraction-limited imaging at a numerical aperture (NA) of up to 1.35 (with immersion). These systems require very complex projection lenses with more than forty optical surfaces (Ref's. 1, 2). Projection optics for extreme ultraviolet (EUV) lithography (Ref. 3) require only six surfaces (all mirrors), in part because they operate at lower NA (up to 0.55), they only cover a narrow ring field, and the surfaces are all aspheric. (EUV lenses cannot be used because there are no EUV-transmitting optical materials, except in very thin films such as EUV mirror coatings.)

References 4-6 disclose a maskless EUV lithography scanner, illustrated in FIG. 1, which has a projection system consisting of only two mirrors M1 and M2 in a flat-image Schwarzschild configuration (Ref. 7). The scanner images an array of point-focus spots from object plane 101 onto a printing surface 102 at image plane 103 with diffraction-limited resolution, and the spots are modulated as the surface is raster-scanned to expose a digitally synthesized exposure image. Only two projection mirrors are needed because the spot-formation optics (an array of zone-plate microlenses 104 proximate object plane 101) offset and neutralize the projection system's geometric aberrations. (The microlenses exhibit chromatic aberration, which is corrected by the projection optics.) EUV illumination 105 is focused by the microlenses into individual beams diverging from points on the object plane, and the beams are focused by mirrors M1 and M2 onto individual, diffraction-limited image points on image plane 103. (A diffractive M2 mirror is used to correct chromatic aberration.) Any undiffracted, zero-order illumination transmitting through the microlenses is blocked by a zero-order stop 106, which can be supported in the projection beam's obscuration zone by tension wires or spider struts.

The maskless scanner can use a spatial light modulator (MEMS microshutters at the microlens foci) to individually modulate the focus spots. Alternatively, the spots can be collectively modulated by a single modulator at the EUV illumination source so that all spots generate identical exposure patterns in a periodic array matching the spot array's periodicity. These two scan modes are termed "spatially-modulated" and "source-modulated", respectively. (Microlens array layouts and scan patterns for maskless lithography are discussed in Ref. 8, Section 7.)

The two-mirror Schwarzschild projection system can also be used for "holographic" mask-projection lithography, which uses a diffractive photomask displaced some distance from the projection system's object plane. A holographic mask, like the microlenses in a maskless system, can correct projection system aberrations. Also, holographic masks can achieve very high exposure dose levels for sparse patterns, and they would be relatively insensitive to defects because the defects are not in focus at the image plane.

Analogous two-mirror, obscured projections systems for UV operation are known in the prior art, e.g., as disclosed in Ref. 9. These systems are more complex than the Schwarzschild apparatus in FIG. 1 in that they include a multi-element lens group to form an intermediate image before the mirror elements. The projection system of FIG. 1 images the object plane onto the image plane without forming an intermediate image. In the maskless writing mode, the microlenses form intermediate point images at the object plane, and in holographic mask-projection lithography the mask forms an intermediate diffractive image at the object plane, but a microlens array and holographic mask both differ from the multi-element lens group of Ref. 9.

SUMMARY OF THE INVENTION

The Schwarzschild EUV projection optics described in Ref's. 4-6 can be adapted for lithography at UV wavelengths (and more generally for visible light as well) with incorporation of lens elements to improve performance and functionality. The primary mirror (M1 in FIG. 1) can be replaced by a back-surface mirror with a small, clear window at the center of the mirror coating for beam transmission, as illustrated in FIG. 2. (There is no center hole in the mirror, only a transmission aperture in the mirror coating.) This provides two advantages over the EUV system's front-surface mirror: First, the transmission window can be smaller and closer to the image plane, allowing the image field width to be significantly increased without incurring much obscuration of the reflected beam. Second, the mirror's front surface operates as a lens, providing additional degrees of freedom that can be used to achieve low-aberration imaging over a wide image field.

Additionally, lens elements can be incorporated in the optical path between the object plane and the primary mirror, as illustrated in FIG. 3, to achieve double-telecentric and substantially distortion-free and aberration-free imaging, without relying on microlenses or a holographic mask for aberration correction. This enables the system to be used for conventional (non-holographic) mask-projection lithography, as well as maskless lithography (with a microlens array) or holographic mask-projection lithography. If it is used for maskless lithography, the microlenses will comprise a periodic pattern, unlike the FIG. 1 and FIG. 2 projection optics, which would require an aperiodic microlens array to correct aberrations and distortion. A periodic microlens array can be efficiently manufactured by a "bootstrap" process using the FIG. 3 lithography system itself to form its own microlenses. A small, master microlens array is first made, e.g., via e-beam patterning. This array is replicated at reduced magnification (e.g., at 4× reduction) using source-modulated, maskless UV lithography, and is periodically tiled to form a large, full-aperture microlens array. A micro-optic focus/alignment sensor array on the bottom of the primary lens (below the reflective surface) enables accurate pattern alignment for periodic tiling or more general large-field image stitching applications.

After the microlens array is formed, it can be used to manufacture of other types of periodic structures, again via source-modulated maskless writing. In particular, it can be used to make spatial light modulator arrays for use in spatially-modulated maskless writing. With a spatial light modulator, the system would be capable of printing aperiodic structures such as photomasks, which can then be used for production of specialized semiconductors, MEMS, micro-optics, etc. via high-throughput, mask-projection lithography. Thus, the projecting system's imaging capabilities enable it to operate as a multi-function tool for performing maskless lithography (either source-modulated or spatially-modulated), mask-projection lithography (either conventional imaging or holographic), mask writing, wafer writing, and patterning of large periodic or aperiodic structures via field stitching to cover large areas exceeding the image field size.

BRIEF DESCRIPTION OF THE DRAWINGS

FIGS. 10A, 10B, 10C, and 10D tabulate design and performance data for the FIG. 3 optical system.

FIG. 12 is an enlarged schematic view of the diffractive mirror surface in FIG. 11.

FIGS. 13A, 13B, 13C, 13D, and 13E tabulate design and performance data for the FIG. 11 optical system.

DESCRIPTION OF SPECIFIC EMBODIMENTS

Lithography Projection Optics and Image Generation

Figure 1:
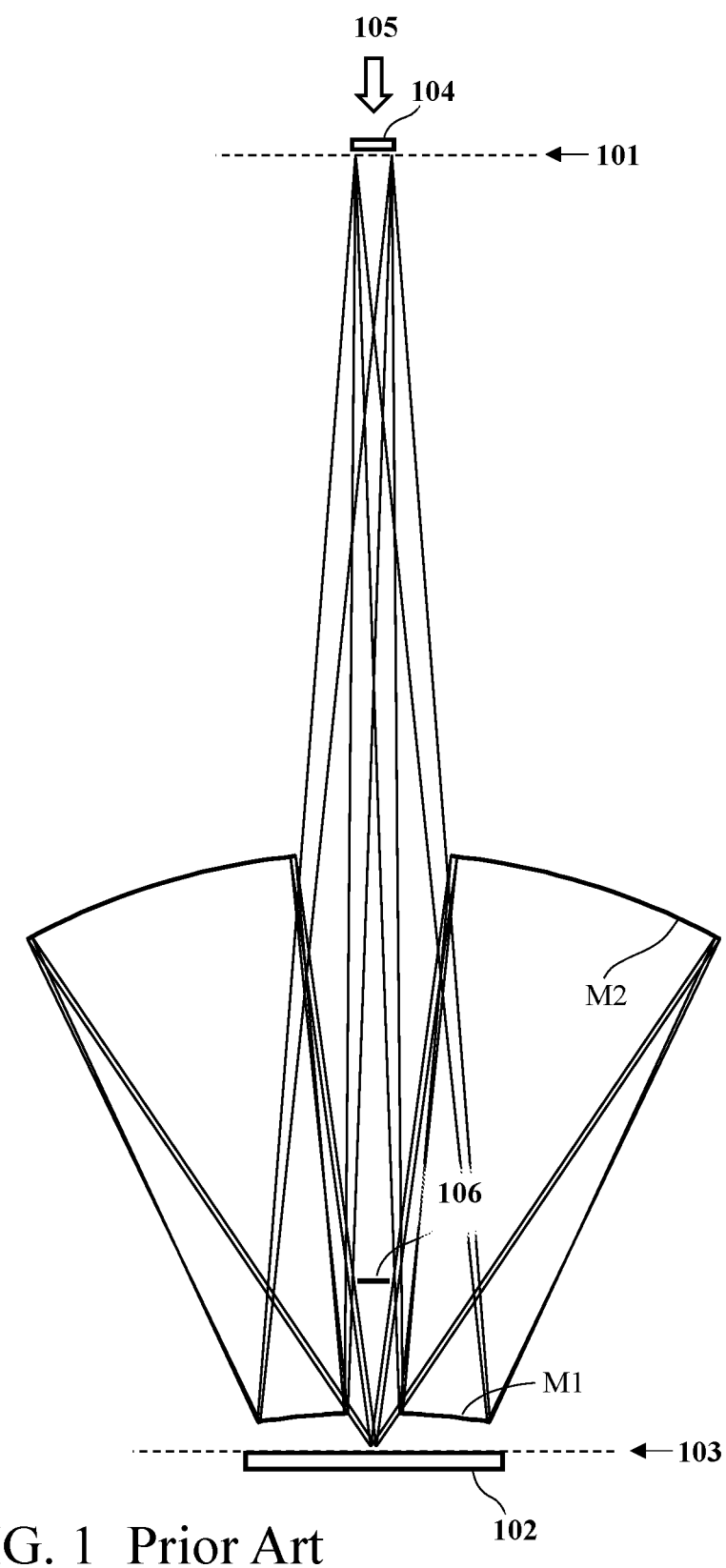
FIG. 1 is a schematic cross-sectional view of a prior-art, maskless EUV lithography scanner employing a two-mirror, Schwarzschild projection system.
Figure 2:
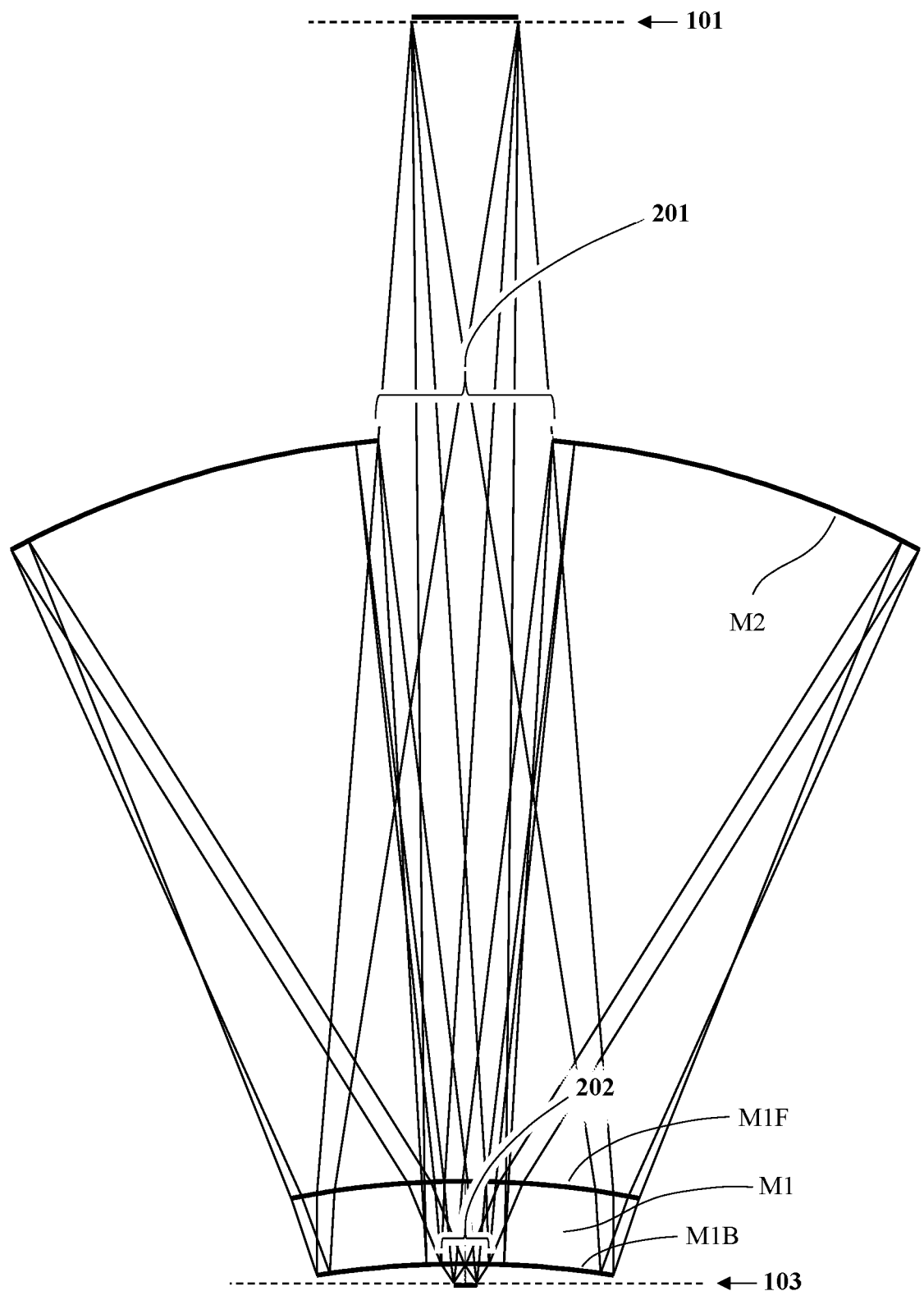
FIG. 2 illustrates an adaptation of the EUV lithography projection system of FIG. 1 for UV lithography.

FIG. 2 illustrates an adaptation of the EUV Schwarzschild projection optics of FIG. 1 for UV operation. Element M1 in FIG. 2 is a back-surface primary mirror with transmitting front surface M1F and reflecting back surface M1B. The secondary mirror M2 can be a front-surface reflector, as in the EUV system. (Standard aluminum mirror coatings can be used for UV operation.) Mirror M2 has a central hole 201 for light transmission. M1 has no central hole, but the mirror coating on M1B has a clear window 202 that is non-reflective and transmitting. The projections system's object plane 101 is imaged by mirrors M1 and M2 onto image plane 103 at reduced magnification. The '850 and '302 applications provide illustrative design data for the FIG. 2 system based on a 404.7-nm operating wavelength.

Figure 3:
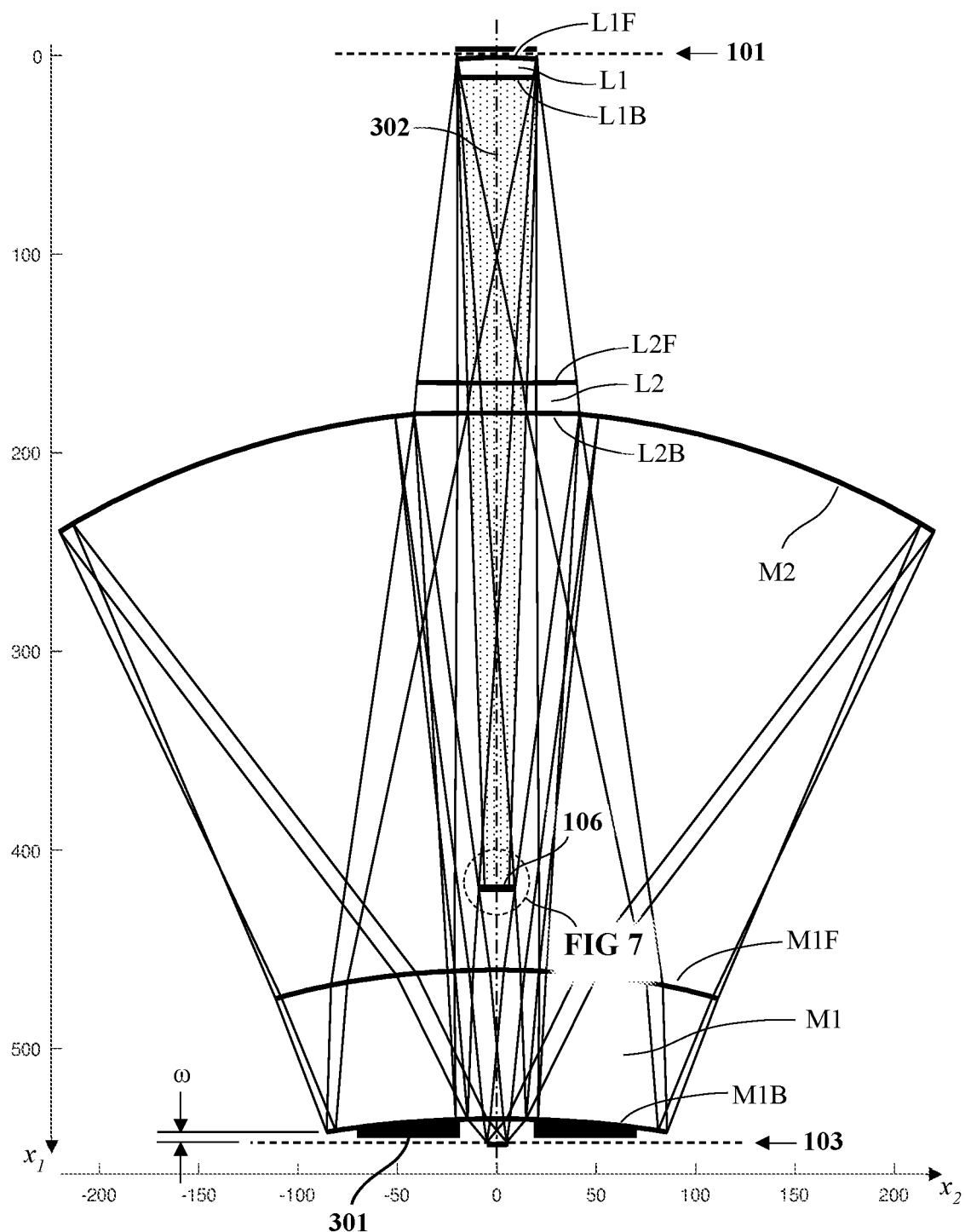
FIG. 3 illustrates a variant of the UV lithography projection optics with addition of two lens elements to achieve double-telecentric, distortion-free imaging.
Figure 4:
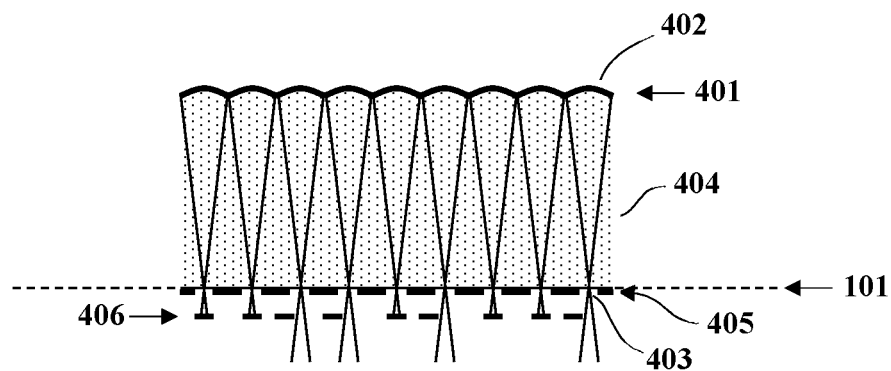
FIG. 4 is a schematic cross-sectional view of a microlens array, which would be used for maskless UV lithography.

FIG. 3 illustrates a similar projection system with two small lens elements L1 and L2 added to achieve substantially distortion-free, double-telecentric imaging from the object plane 101 to the image plane 103. These elements do not form an intermediate image between the object and image planes. However, in a maskless writing operation a microlens array 401, illustrated cross-sectionally in FIG. 4, forms intermediate point images at the object plane 101. For example, microlens 402 focuses incident illumination through focal point 403 on plane 101. The microlenses are illustrated as refracting elements on a transparent substrate 404, which has an array of pinhole apertures 405 on its back side (in plane 101) to spatially filter the convergent beams. The microlenses could alternatively be diffracting elements such as zone-plate lenses or phase-Fresnel lenses, or could be achromatic doublets of the type described in Ref. 8.

An array of MEMS microshutters 406 can be added to the microlens array to modulate the individual beams for spatially-modulated scanning. Without the shutters, the microlens array can print periodic patterns, using a single modulator at the source to collectively modulate the beams in source-modulated scanning mode.

Figure 5:
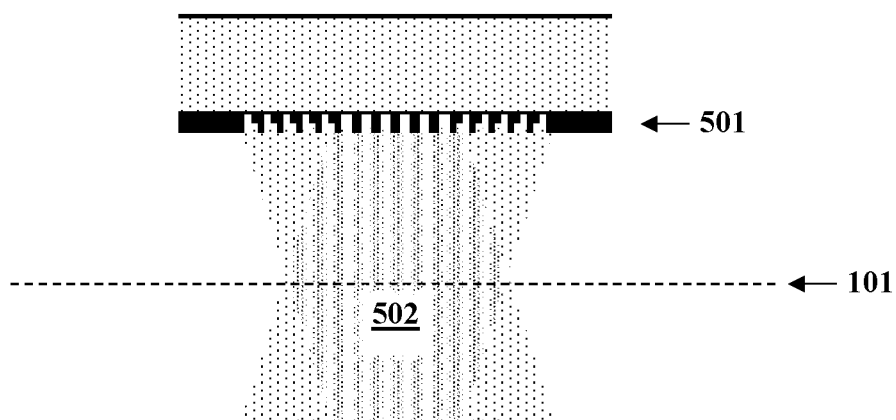
FIG. 5 is a schematic cross-sectional view of a holographic photomask for UV mask-projection lithography.

Holographic mask-projection lithography is similar to maskless lithography, but with a diffractive mask 501 replacing the microlens array, as illustrated in FIG. 5. The operation of a holographic mask is similar to a microlens array, except that it can produce intermediate image patterns other than periodic point arrays at object plane 101. For example, FIG. 5 depicts a dense line/space image pattern 502 formed via interference lithography. There is no spatial filter array or spatial light modulator (such as pinhole array 405 or microshutters 406 in FIG. 4), and the writing surface is not scanned; it is statically imaged and stepped between exposures. A holographic mask can be either in front of or behind the object plane.

Figure 6:
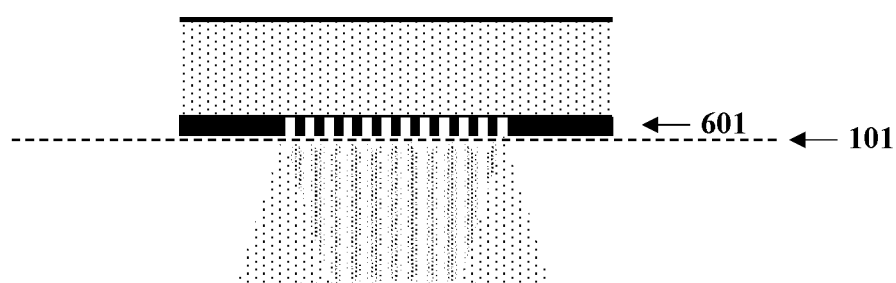
FIG. 6 is a schematic cross-sectional view of a conventional (non-holographic) photomask for UV mask-projection lithography.

Conventional (non-holographic) mask-projection lithography uses a transmission mask 601 located at object plane 101, as illustrated in FIG. 6. The mask does not project an image pattern onto the object plane; the pattern is formed directly on the mask. Holographic and non-holographic masks can be either transmitting, as illustrated in FIGS. 5 and 6, or reflective, e.g., as illustrated in Ref. 6.

In each of these imaging modes either the image pattern generator (the microlens array or mask) or the projection system needs to block or suppress any zero-order (undiffracted) light that is directed straight into the M1B transmission window without intercepting the reflective surface.

Figure 7:
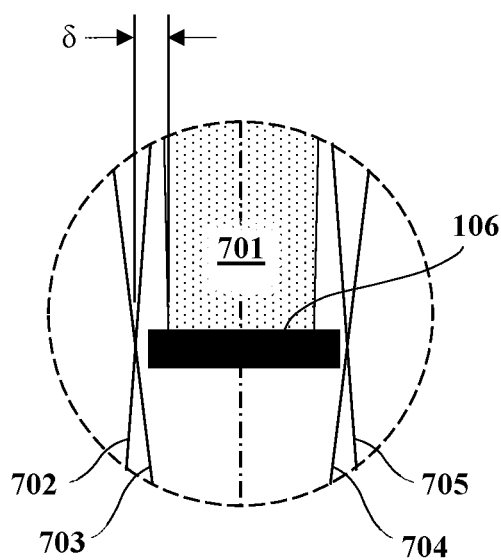
FIG. 7 is an enlarged view of the zero-order stop in FIG. 3.

A zero-order stop 106 (FIG. 3) can be suspended in the obscuration zone (e.g., via tension wires or spider struts) to block zero-order light. An enlarged view of stop 106 is illustrated in FIG. 7. The shaded area 701 represents the zero-order beam, and rays 702, 703, 704, and 705 are limit rays defined by the mirror obscurations. The radial stop clearance, defined as the clearance between the zero-order beam and the unobstructed ray envelope, is indicated as 5.

Focus and Alignment

An optical positioning sensor unit 301 (FIG. 3) attached to the bottom of mirror M1 can be used to measure focus and alignment of the printing surface relative to the projection system and to provide feedback to a positioning control system. (The working distance ω between the M1B edge and image plane 103 should be sufficient to accommodate the sensor unit.) A variety of miniature or micro-optic sensor mechanisms could be used such as Moiré, confocal, interferometric, etc. Two possibilities are illustrated in FIGS. 8 and 9.

Figure 8:
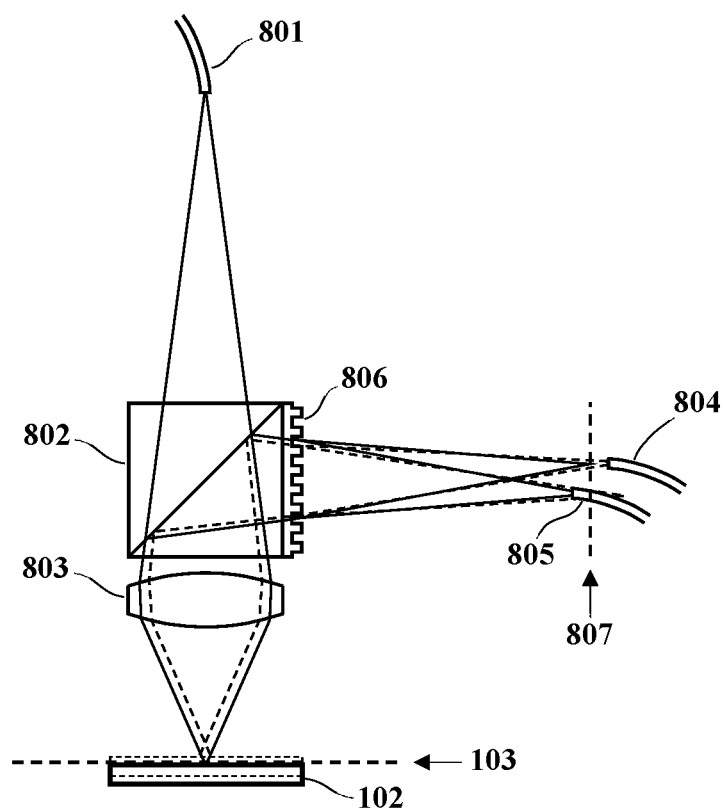
FIG. 8 schematically illustrates a focus sensor based on multi-level confocal imaging, for use in the FIG. 3 DUV lithography system.

FIG. 8 schematically illustrates a focus sensor based on multilevel confocal imaging. Multiple such sensor units could be used to provide surface height measurements over an array of measurement locations. A point light source such as a single-mode optical fiber 801 projects radiation (e.g., from a remote diode laser) through a beam splitter 802 and lens 803. The lens focuses the radiation onto the image plane 103. A printing surface 102 at or proximate the image plane reflects the radiation back through the lens, and the beam splitter 802 directs the reflected radiation onto a pair of point detectors such as fiber optic collectors 804 and 805 connected to remote optical sensors. A diffraction grating 806 further splits the beam into two beams that are focused onto detectors 804 and 805 proximate focal plane 807. One of the detectors is slightly in front of focal plane 807, and the other is slightly behind it, so small focus displacements of surface 102 from image plane 103 will cause one detector signal to increase while the other one decreases. The two detector signals in combination provide a sensitive, signed measure of focus error. FIG. 8 illustrates an in-focus condition with solid lines, and an out-of-focus condition with dashed lines.

Figure 9A:
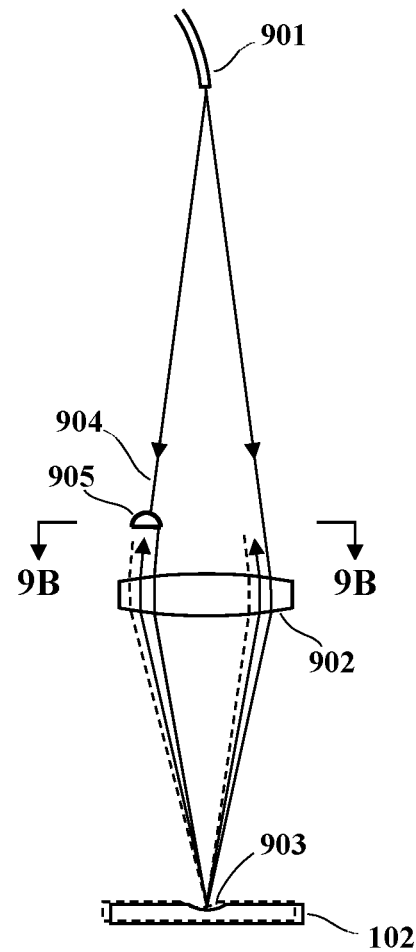
FIGS. 9A and 9B schematically illustrate an alignment sensor based on far-field scattering from alignment targets, for use in the FIG. 3 DUV lithography system.
Figure 9B:
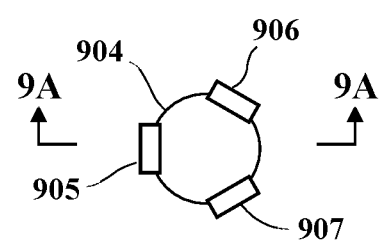

FIGS. 9A and 9B illustrate an alignment sensor based on far-field scattering from alignment targets. Multiple such sensor units can be used to cover an array of targets. FIG. 9A is a vertical sectional view of the sensor and FIG. 9B is a horizontal sectional view. A point light source such as a single-mode optical fiber 901 projects radiation through a lens 902, which focuses the radiation onto an alignment target 903 on printing surface 102. The target could be a topographic feature such as a small dimple or bump on the surface. Optical detectors straddling the beam periphery 904, such as detectors 905, 906, and 907, sense asymmetries in the diffraction-limited return beam resulting from surface tilt or diffractive scatter at the illuminated portion of target 903. As the surface scans across the focused beam, the spatial distribution of far-field illumination on the detectors varies, resulting in signal variations that provides a measure of the target's lateral position. Solid lines in FIG. 9A illustrates a condition with the beam centered on the target and with the detector signals in balance, and dashed lines illustrate an off-center condition resulting in an imbalance between the detector signals.

Optical Design Data

Following is an outline of illustrative optical design data for FIG. 3. The optical geometry is referenced to $(x_1, x_2, x_3)$ Cartesian coordinates and is axially symmetric around the optical axis 302 at $x_2=x_3=0$. FIG. 3 is a cross-sectional view in the $x_1$, $x_2$ plane, and the axes are demarked in millimeter units. The coordinate origin is at the object plane 101 and $x_1$ is downward-positive (i.e., positive in the object-to-image direction).

The projection system comprises the following optical elements and surfaces:

Lens L1 (front and back surfaces L1F and L1B)
Lens L2 (front and back surfaces L2F and L2B)
Back-surface primary mirror M1 (front and back surfaces M1F and M1B)
Front-surface secondary mirror M2 (one surface only)

The optical light path intercepts the surfaces in the following order:

1. Object plane 101
2. L1F transmission
3. L1B transmission
4. L2F transmission
5. L2B transmission
6. M1F transmission
7. M1B reflection
8. M1F transmission
9. M2 reflection
10. M1F transmission
11. M1B transmission
12. Image plane 103

Predetermined design specifications are tabulated in FIG. 10A, calculated design data based on performance optimization is tabulated in FIGS. 10B and 10C, and performance characteristics are summarized in FIG. 10D. This design is adapted for a 266-nm operating wavelength using, e.g., the Coherent Azure laser (Ref. 10) or the Oxide laser (Ref. 11) as an illumination source. The object-to-image demagnification is 4×, the image-side NA is 0.65, the image field diameter is 10 mm, and the M2 diameter is 440 mm. (All surface diameter specifications are clear-aperture diameters.) The working distance, i.e., $x_1$ offset from the M1B edge to the image plane (indicated as w in FIG. 3) is 5 mm. Lens L2 is inside the M2 central hole, and the L2B surface edge location is on surface M2. Some of the axial spacings, including the L1, L2, and M1 axial thicknesses, are predetermined as indicated in FIG. 10A and are not optimized. All lenses are $SiO_2$, with a refractive index of 1.4997. The ambient optical medium is assumed to have refractive index 1. In practice the design would need to account for the refractive index of air. (The system need not operate in vacuum, but the ambient pressure, temperature, and humidity may need to be controlled.)

The design parameters in FIGS. 10B and 10C are optimized for minimum mean-square point-imaging errors (based on geometric ray tracing), with optimization constraints imposed to achieve substantially distortion-free, double-telecentric imaging and to maintain the demagnification, M2 diameter, M1 working distance ω, and L2B edge location on M2. The surface shapes are described by a "superconic" equation, as specified in FIG. 10C. (In this equation $x_1$[ctr] is the surface's axial $x_1$ coordinate.)

The performance data outlined in FIG. 10D is based on the optimized design, neglecting manufacturing tolerances. The point-imaging phase aberrations are insignificant, 0.0013-wave RMS (root-mean-square) and 0.0056-wave P-V (peak-to-valley). Distortion and telecentricity errors are also insignificant. The obscuration NA is 0.14, resulting in an areal obstruction ratio of $(0.14/0.65)^2=0.047$. The zero-order stop's radial clearance δ FIG. 7) is 3.0 mm.

The above design could be improved to increase the working distance and/or reduce the obscuration, e.g., by adding another lens in the space between M1 and M2. Alternatively, a diffractive, phase-Fresnel mirror surface can be used for M1B (for the reflecting area; the window need not be diffractive). A design with a diffractive M1B surface is illustrated in FIG. 11.

The diffractive surface provides additional design degrees of freedom, and it improves the working distance and/or reduces the obscuration by flattening surface M1B. The design needs to be constrained to maintain sufficient clearance for the zero-order stop; otherwise, the clearance δ in FIG. 7 could become negative. Complete flattening of M1B would shift most of the mirror's optical power into the diffractive structure, making the structure more difficult to manufacture and increasing optical aberrations.

Figure 11:
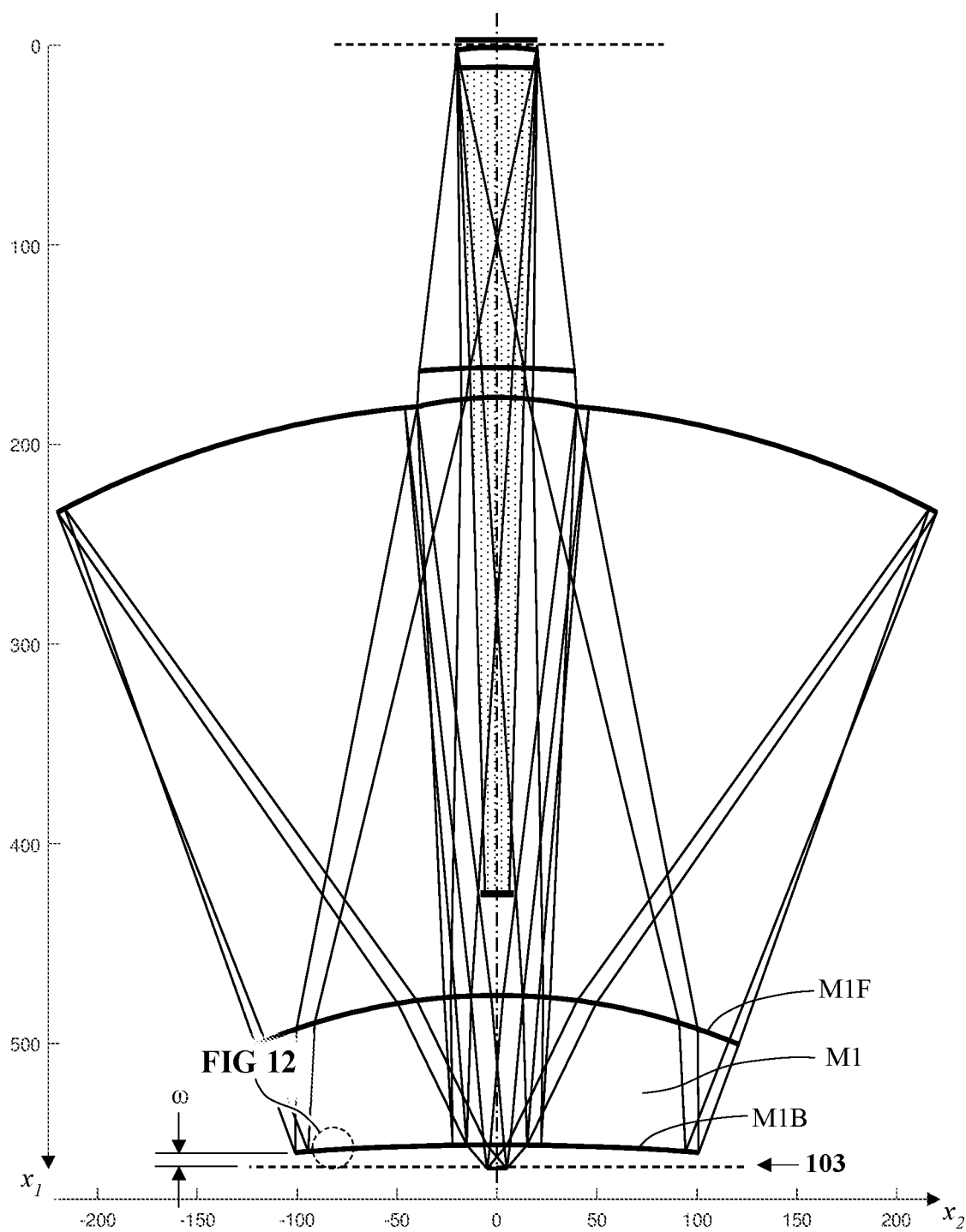
FIG. 11 illustrates a variant of the UV lithography projection optics with a diffractive primary mirror, for increasing the working distance without incurring greater obscuration loss.

The illustrative design in FIG. 11 increases the working distance ω to 8 mm (from 5 mm for FIG. 3). Two addition design constraints are also imposed: The obscuration NA is constrained to 0.13, resulting in an areal obscuration fraction of 4% (compared to 4.7% for FIG. 3), and the zero-order stop clearance δ is set to 3 mm (approximately the same as FIG. 3). The M1B surface sag is 3.8 mm in FIG. 11, compared to 6.6 mm in FIG. 3.

FIG. 12 shows a schematic, enlarged cross-section of diffractive surface M1B, illustrating detail of the diffractive structure. The illustrated surface comprises a rotationally symmetric, blazed grating pattern with linear-ramp grating facets such as facet 1201. The facet height h is approximately 90 nm over the entire surface, and the line density is approximately proportional to the radial distance from the lens axis. At the edge of the lens the grating period Λ is 1146 nm. (If the working distance ω were increased from 8 to 10 mm the period would be reduced to 509 nm.)

FIGS. 13A-13E tabulate design and performance data for FIG. 11. The diffractive structure on M1B is characterized by its "grating phase" GP, which is an even function of the cylindrical radius coordinate $r=\sqrt{x_2^2+x_3^2}$, as illustrated in FIG. 13C. GP is defined in phase cycle units (1 cycle=2π radians) and is integer-valued at the grating facet boundaries. The surface-tangential gradient of GP on M1B defines the grating line density.

Manufacturing Technology

Figure 14:
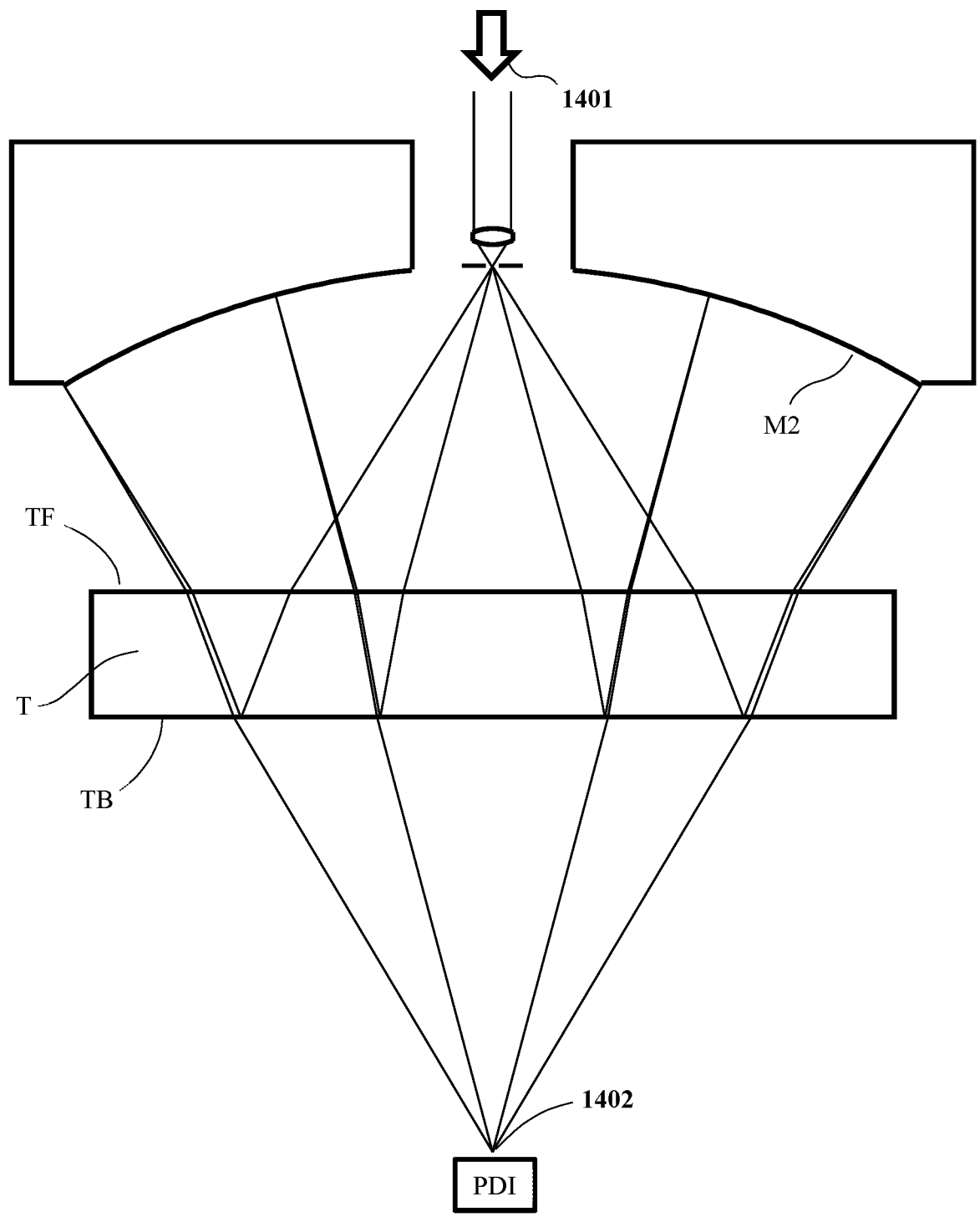
FIG. 14 illustrates an interferometric test apparatus for testing the secondary mirror in the FIG. 3 projection system.

The projection system design makes use of strongly aspheric mirrors, which can present challenges for manufacturing, especially for measuring the surface form error. The secondary mirror M2 can be tested using a flat-plate spherical aberration corrector, as illustrated in FIG. 14. A pinhole-filtered laser beam 1401 is directed through the central hole in M2 onto a flat test plate T with transparent front surface TF and partially reflective back surface TB. The beam reflected from TB is retroreflected by M2, transmits through T, and is brought to a focus at point 1402 where it is analyzed by a point-diffraction interferometer PDI.

For the FIG. 3 design (FIGS. 10A-10C design data), a flat, SiO$_2$ test plate of thickness 65 mm can reduce the spherical aberration at point 1402 to 6 waves RMS (25 waves P-V) at a 633-nm test wavelength. If one of the plate surfaces is made slightly curved the aberration can be significantly reduced. For example, a plate with 110-mm thickness and TF convex curvature of $1.074 \cdot 10^{-4}$ mm$^{-1}$ can reduce the aberration to 0.3 wave RMS (1.6 wave P-V). The aberration can be measured by the interferometer and compared to the design do determine the M2 form error, which can be corrected via optical polishing and ion-beam figuring (IBF). The test plate could itself be IBF-processed to eliminate spherical aberration at focal point 1402.

Figure 15:
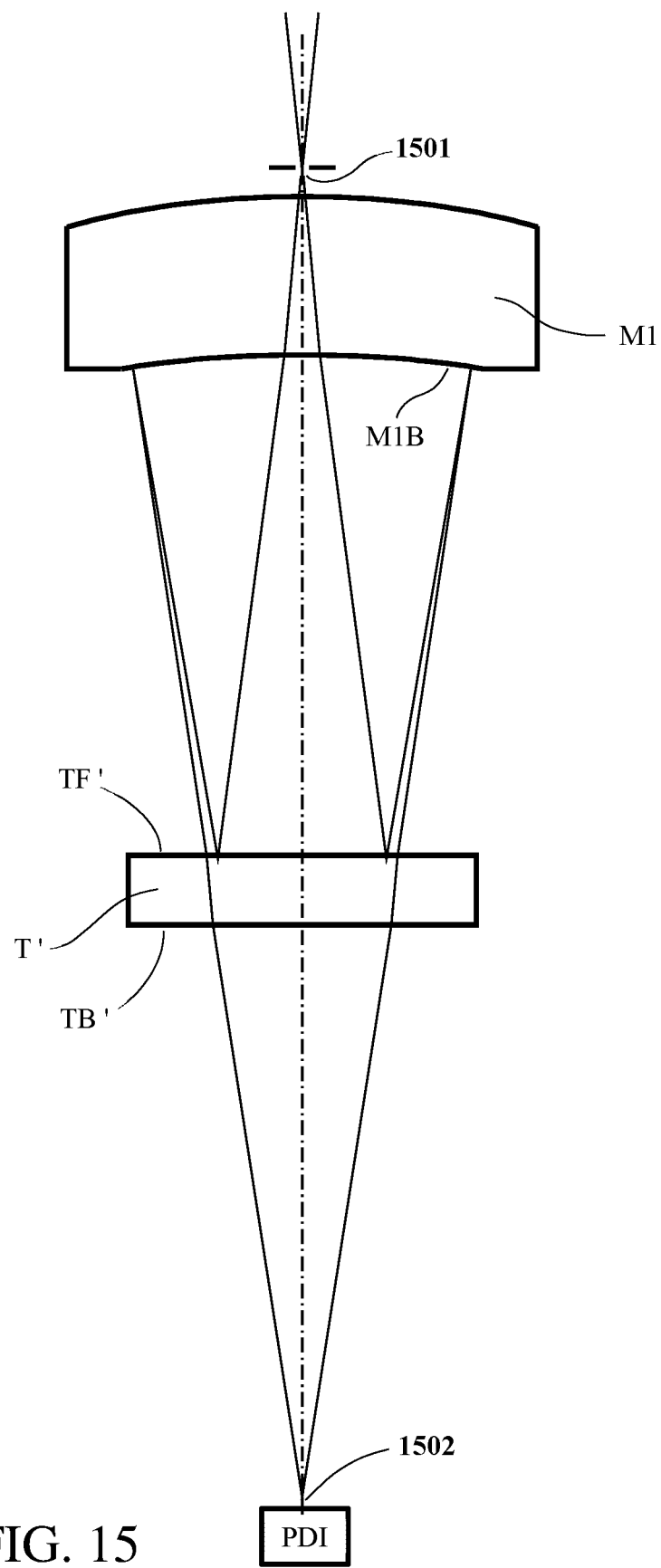
FIG. 15 illustrates an interferometric test apparatus for testing the primary mirror in the FIG. 3 projection system.

The primary mirror's back surface M1B can be similarly tested by retroreflecting a test beam from its back side, as illustrated in FIG. 15. In this case the spherical aberration is too strong to correct with a simple test plate, but a computer-generated hologram (CGH) can be used as a null corrector. The test plate T' in FIG. 15 is a flat plate with a partially reflective front surface TF' and with a CGH formed on its back side TB'. The test beam originates from a spatially-filtered laser source 1501 as in FIG. 14, but in this case the mirror has no central hole and beam transmits through M1. The CGH eliminates spherical aberration at focal point 1502.

The transmitting front surface M1F can be tested in the fully assembled projection system (e.g., FIG. 3 or 11) after all other surfaces have been formed, using the projection system as a null corrector. This test would need to be done at the operating wavelength (e.g., 266 nm). A spatially-filtered laser beam is directed through a point on the object plane 101 and is analyzed by a PDI proximate image plane 103; or the beam can alternatively be directed into the system from the image plane and analyzed at the object plane. The measured phase error and M1F correction will compensate for any errors in the other surfaces, at least for the field point at which the system is tested.

In a conventional PDI (Ref. 12), an attenuated transmission surface with a clear pinhole filter is placed at or near the focal point of a convergent optical beam to generate a far-field interference pattern, which can be analyzed to determine the beam aberrations. A variety of alternative interferometer types (e.g., Ronchi-grating test, Foucault knife-edge test, phase Foucault knife-edge test, Zernike phase-contrast test) can also be used for aberration measurement (Ref. 13). For example, the Zernike phase test (Ref's. 14, 15) is a type of PDI that incorporates an optical phase shift in the pinhole. In all of these interferometer types, the focused beam interacts with a diffracting object (e.g., a pinhole filter), which can be scanned in up to three dimensions as the far-field diffraction pattern is measured. The scanning operation and data analysis are similar to ptychography, which can reconstruct unknown attributes of both the aberrated beam and the diffracting object based on interferometric data (Ref's 16, 17). Interferometric characterization of a lithography projection system's point-imaging performance at multiple image field points can be used to simultaneously resolve surface shape errors in all of the optical surfaces, as well as positional alignment errors in the optics, the laser source point, and the pinhole or diffracting object.

The projection optics illustrated in FIG. 3 or 11 can be manufactured by first forming a master set of optics, and then using a fully assembled projection system for interferometric testing of production optics with individual elements replaced by production components. The master set can be interferometrically tested by measuring point-imaging aberrations at multiple field points to simultaneously characterize form errors of all optical surfaces. However, the aberration performance of production systems is not limited by the master optics' form accuracy. If the master optics' surface errors are accurately measured, then their known surface errors can be taken into account in the interferometric characterization of production optics. Moreover, the system's optical performance is not fundamentally limited by form errors in individual components, because errors in one component can be compensated for, to an extent, by compensating errors in other elements (Ref. 18).

The phase-Fresnel diffractive M1B mirror in FIG. 11 can be formed via grayscale lithography, using a lathe-type laser writing tool for resist exposure (Ref's. 19, 20), and a similar process can be used to form CGH test plates for manufacturing aspheric optics. Accurately contoured Fresnel facets can be etched into a SiO$_2$ substrate by using selective etch processes similar to those used to form X-ray gratings (Ref's. 21, 22). The grating geometry must be controlled to preserve accurate phase coherence (i.e., minimal optical aberrations) in the first diffracted order, and to minimize optical scatter and flare due to diffraction into other orders. Uniform (low-frequency) phase errors can be corrected by applying a standard IBF process to the grating, in the same manner as conventional lens figuring. Scatter and flare can be minimized by accurately blazing the grating for maximum efficiency in the first order. The fraction of power diffracted into other orders, relative to the first order, is approximately proportional to the square of the blaze angle error. For example, a 5% error in the blaze angle would result in approximately 0.8% scatter into other orders, and a 2.5% error would result in 0.2% scatter.

REFERENCES

The following additional patent and literature references are referred to in this disclosure and are incorporated by reference:

Ref. 1: Matsuyama, Tomoyuki, Yasuhiro Ohmura, and David M. Williamson. "The lithographic lens: its history and evolution." Optical Microlithography XIX. Vol. 6154. International Society for Optics and Photonics, 2006. http://www.lithoguru.com/scientist/litho_history/Lithographic_lens_history_and_evolution_Matsuyama_2006.pdf Ref. 2: Shafer, David, et al. "Catadioptric projection objective." U.S. Pat. No. 8,208,198. 26 June 2012.

Ref. 3: S. Migura. "Optics for EUV Lithography", in 2019 EUVL Workshop, P24, EUV Litho, Inc. https://www.euv-litho.com/2019/P24.pdf Ref. 4: Johnson, Kenneth C. "Scanned-spot-array EUV lithography system." U.S. Pat. No. 9,097,983. 4 Aug. 2015.

Ref. 5: Johnson, Kenneth C. "EUV Lithography System with Diffraction Optics", 2019. https://vixra.org/pdf/1911.0361v1.pdf Ref. 6: K. Johnson. "EUV Lithography Design Concepts using Diffraction Optics", in 2020 EUVL Workshop, P22, EUV Litho, Inc. https://vixra.org/pdf/2007.0167v2.pdf Ref. 7: M. Bass, ed., Handbook of Optics, 2nd ed. (Optical Society of America, Washington, D.C., 1995), Vol. 2. (p. 18.15)

Ref. 8: Johnson, K. C. (2019). Maskless EUV lithography, an alternative to e-beam. Journal of Micro/Nanolithography, MEMS, and MOEMS, 18(4), 043501. https://doi.org/10.1117/1.JMM.18.4.043501

Ref. 9: Shafer, David R., Yung-ho Chuang, and B. Tsai Bin-ming. "Broad spectrum ultraviolet catadioptric imaging system." U.S. Pat. No. 5,717,518. 10 Feb. 1998.

Ref. 10: Coherent, Inc., Azure NX laser product information. https://www.coherent.com/lasers/laser/azure Ref. 11: Oxide Corp., 266-nm laser product information. https://www.opt-oxide.com/en/products/266 nm/

Ref. 12: Smartt, R. N., and W. H. Steel. "Theory and application of point-diffraction interferometers." Japanese Journal of Applied Physics 14, no. S1 (1975): 351. https://doi.org/10.7567/JJAPS.14S1.351 https://wp.optics.arizona.edu/jcwyant/wp-content/uploads/sites/13/2016/08/10-JJAPS-14S1-351.pdf Ref. 13: Barakat, Richard. "General diffraction theory of optical aberration tests, from the point of view of spatial filtering." JOSA 59, no. 11 (1969): 1432-1439. https://doi.org/10.1364/JOSA.59.001432

Ref. 14: Golden, Lewis J. "Zernike test. 1: Analytical aspects." Applied optics 16, no. 1 (1977): 205-213. https://doi.org/10.1364/AO.16.000205

Ref. 15: Golden, Lewis J. "Zernike test. 2: Experimental aspects." Applied optics 16, no. 1 (1977): 214-217. https://doi.org/10.1364/AO.16.000214

Ref. 16: Wojdyla, Antoine, Ryan Miyakawa, and Patrick Naulleau. "Ptychographic wavefront sensor for high-NA EUV inspection and exposure tools." In Extreme Ultraviolet (EUV) Lithography V, vol. 9048, p. 904839. International Society for Optics and Photonics, 2014. https://doi.org/10.1117/12.2048386

Ref. 17: Dwivedi, Priya, Silvania F. Pereira, and H. Paul Urbach. "Ptychography as a wavefront sensor for high-numerical aperture extreme ultraviolet lithography: analysis and limitations." Optical Engineering 58, no. 4 (2019): 043102. https://doi.org/10.1117/1.OE.58.4.043102

Ref. 18: Dumas, Paul R., Robert W. Hallock, and Alex Pisarski. "Applications and benefits of 'perfectly bad' optical surfaces." Optical Fabrication, Testing, and Metrology III. Vol. 7102. International Society for Optics and Photonics, 2008. https://doi.org/10.1117/12.797718

Ref. 19: "Fabrication of Diffractive Optical Elements using Direct Laser Writing." University of Stuttgart, Institute of Applied Optics. https://www.ito.uni-stuttgart.de/en/research/group-ido/fabrication-of-diffractive-optical-elements/Ref.

Ref. 20: Reichle, R.; Yu, K.; Pruss, C.; Osten, W. "Spin-coating of photoresist on convex lens substrates." In DGaO-Proceedings 2008, 109. ISSN: 1614-8436 (2008) https://www.dgao-proceedings.de/download/109/109_p44.pdf Ref. 21: Voronov, D. L., E. M. Gullikson, and H. A. Padmore. "Ultra-low blaze angle gratings for synchrotron and free electron laser applications." Optics express 26.17 (2018): 22011-22018. https://doi.org/10.1364/OE.26.022011

Ref. 22: Siewert, F., et al. "Gratings for synchrotron and FEL beamlines: a project for the manufacture of ultra-precise gratings at Helmholtz Zentrum Berlin." Journal of synchrotron radiation 25.1 (2018): 91-99. https://journals.iucr.org/s/issues/2018/01/00/x15026/x15026.pdf

What is claimed is:

1. An optical lithography exposure apparatus comprising an image pattern generator and a projection system, wherein the projection system images an object plane onto an image plane without forming an intermediate image between the object and image planes;

the image pattern generator generates an optical image pattern on the object plane, and the projection system conveys the image pattern to a printing surface at the image plane;

the image pattern generator is either a microlens array, which condenses illuminating radiation onto an array of focus spots on the object plane, or a holographic projection mask, which is displaced from the object plane and produces a diffractive image pattern on the object plane, or a non-holographic mask located at the object plane;

the projection system comprises primary and secondary mirrors in a flat-image Schwarzschild configuration, wherein the primary mirror is a back-surface reflector with a transmitting front surface and a reflecting back surface;

the primary mirror's back surface has a central, non-reflective window for beam transmission, and the secondary mirror has a central open hole for beam transmission;

optical radiation from the image pattern on the object plane transmits through the secondary mirror's central hole, is then reflected from the primary mirror, then reflects from the secondary mirror and transmits through the primary mirror's transmission window to the image plane.

2. The lithography exposure apparatus of claim 1 wherein the primary mirror's front and back surfaces are convex and the secondary mirror is concave.

3. The lithography exposure apparatus of claim 1 wherein the primary mirror's front surface is convex, its back surface is diffractive, and the secondary mirror is concave.

4. The lithography exposure apparatus of claim 1, further comprises transmitting lens elements between the object plane and the secondary mirror's central hole, wherein the lenses and mirrors are configured to provide substantially distortion-free, double-telecentric imaging from the object plane to the image plane.

5. The lithography exposure apparatus of claim 1, wherein the image pattern generator is a microlens array, the focus spots are individually modulated by MEMS shutters proximate the object plane, and the printing surface is scanned in the image plane as the focus spots are modulated to synthesize a digital exposure image on the printing surface.

6. The lithography exposure apparatus of claim 1, wherein the image pattern generator is a microlens array, the focus spots are collectively modulated by a single modulator that modulates the illuminating radiation, and the printing surface is scanned in the image plane as the focus spots are modulated to synthesize a digital exposure image on the printing surface.

7. The lithography exposure apparatus of claim 1, further comprising a zero-order stop in the projection system for blocking radiation that would, in the absence of the stop, be directed from the object plane directly through the primary mirror's transmission window without being reflected by the primary mirror.

8. The lithography exposure apparatus of claim 1, further comprising a focus/alignment sensor system attached to the primary mirror's back surface for sensing and controlling the positional relationship between the printing surface and the projection system.

9. The lithography exposure apparatus of claim 8, wherein the focus/alignment sensor system comprises a multi-level confocal sensor for focus sensing.

10. The lithography exposure apparatus of claim 8, wherein the focus/alignment sensor system focuses radiation onto the printing surface and detects far-field, reflective scattering of the radiation by alignment targets on the surface for alignment sensing.

* * * * *